(12) United States Patent
Nicholas et al.

(10) Patent No.: US 10,503,332 B2
(45) Date of Patent: Dec. 10, 2019

(54) LOCAL USER INTERFACE FOR EXPLOSION RESISTANT FIELD INSTRUMENTS USING CAPACITIVE TOUCH SENSING

(71) Applicant: FISHER CONTROLS INTERNATIONAL LLC, Marshalltown, IA (US)

(72) Inventors: Davin S. Nicholas, Marshalltown, IA (US); Matthew J. Kemp, Marshalltown, IA (US); Mitchell S. Panther, Marshalltown, IA (US)

(73) Assignee: FISHER CONTROLS INTERNATIONAL LLC, Marshalltown, IA (US)

( * ) Notice: Subject to any disclaimer, the term of this patent is extended or adjusted under 35 U.S.C. 154(b) by 0 days.

(21) Appl. No.: 15/723,033

(22) Filed: Oct. 2, 2017

(65) Prior Publication Data

US 2019/0102000 A1  Apr. 4, 2019

(51) Int. Cl.
*G06F 3/044* (2006.01)
*H03K 17/96* (2006.01)
(Continued)

(52) U.S. Cl.
CPC .......... *G06F 3/044* (2013.01); *G02F 1/13338* (2013.01); *G02F 1/133308* (2013.01);
(Continued)

(58) Field of Classification Search
CPC ...... G01F 15/06; G01F 1/8431; G01F 23/284; G01F 1/8422; G06F 3/044; G06F 3/0416;
(Continued)

(56) References Cited

U.S. PATENT DOCUMENTS 5,721,664 A * 2/1998 Uken ................ H01C 8/04
361/125
6,366,436 B1 * 4/2002 Maier ................ G01F 15/06
361/93.9
(Continued)

FOREIGN PATENT DOCUMENTS

DE  102016105362 A1  9/2017

OTHER PUBLICATIONS

International Search Report and Written Opinion, corresponding International Application No. PCT/US2018/051844, dated Dec. 5, 2018.

*Primary Examiner* — Richard J Hong
(74) *Attorney, Agent, or Firm* — Marshall, Gerstein & Borun LLP (57) ABSTRACT

An apparatus includes a housing, a touch sensor, a display, and a control module. The housing has a body defining a volume to accommodate a process control device and is adapted to withstand a threshold internal pressure greater than an external pressure. The housing further has a transparent portion having first and second surfaces. The touch sensor is disposed adjacent to the second surface of the transparent portion and senses an input received within a minimum distance from the first surface of the transparent portion. The display is disposed adjacent to the touch sensor and displays at least one adjustable variable corresponding to the process control device.

23 Claims, 4 Drawing Sheets

(51) Int. Cl.
*G02F 1/1333* (2006.01)
*G05B 19/042* (2006.01)
*G06F 3/041* (2006.01)

(52) U.S. Cl.
CPC ....... G05B 19/0423 (2013.01); H03K 17/962 (2013.01); *G02F 2001/133311* (2013.01); *G02F 2001/133331* (2013.01); *G02F 2201/503* (2013.01); *G05B 2219/24028* (2013.01); *G05B 2219/2631* (2013.01); *G06F 3/0416* (2013.01); *G06F 2203/04103* (2013.01)

(58) Field of Classification Search
CPC ........ G06F 2203/04103; B21D 26/033; G01D 11/245; G01D 5/54; H05K 1/0213; H01C 8/04; H03K 17/962; G02F 1/133308; G02F 1/13338; G02F 2001/133311; G02F 2201/503; G05B 19/0423; G05B 2219/24028; G05B 2219/2631
See application file for complete search history.

(56) References Cited

U.S. PATENT DOCUMENTS

| | | | |
|---|---|---|---|
| 2004/0183550 A1* | 9/2004 | Fehrenbach | G01D 5/54 324/662 |
| 2011/0271756 A1* | 11/2011 | Lalla | G01F 1/8422 73/32 A |
| 2011/0317390 A1* | 12/2011 | Moser | G01D 11/245 361/807 |
| 2012/0236033 A1 | 9/2012 | Rud et al. | |
| 2012/0310545 A1* | 12/2012 | Drahm | G01F 1/8431 702/22 |
| 2015/0159811 A1* | 6/2015 | Christie | B21D 26/033 137/343 |
| 2016/0282851 A1 | 9/2016 | Cartwright et al. | |
| 2017/0142840 A1* | 5/2017 | Surinya | H05K 1/0213 |
| 2017/0164494 A1* | 6/2017 | Duivenvoorden | G01F 23/284 |
| 2018/0032170 A1* | 2/2018 | Shaik | G06F 3/044 |
| 2019/0014391 A1* | 1/2019 | Brockhaus | G01D 11/245 |

* cited by examiner

LOCAL USER INTERFACE FOR EXPLOSION RESISTANT FIELD INSTRUMENTS USING CAPACITIVE TOUCH SENSING

FIELD OF THE DISCLOSURE

The present invention relates generally to explosion resistant process control devices, and, more specifically, to an interface for an explosion resistant field instrument.

BACKGROUND

Process control devices are typically used to control, measure, and/or perform other functions within a process such as opening or closing valves and measuring process parameters. For example, some process control devices may control the pressure of control fluid used to position a pneumatically-controlled device, such as a regulator. For example, an electro-pneumatic controller can be used to control a field device associated with the controller, which may be, for example, valves, valve positioners, switches, transmitters, and sensors (e.g., temperature, pressure, and flow rate sensors). In some forms, these controllers may control the pressure of control fluid into a pneumatic actuator of a process control valve or regulator to position the process control valve or regulator. For example, a valve may open or close in response to a control output received from a controller, or may transmit to a controller a measurement of a process parameter so that the controller can utilize the measurement as a control input. In some cases, the controllers may be used in hazardous environments that are susceptible to damage. Further, the controllers and regulators may use fluids that are flammable or explosive in nature. In such cases, explosion proof containers are used to contain explosions therein and to protect the installed environment as well as other control instruments to ensure proper operation.

Explosion resistant process control devices are capable of withstanding explosions and other shocks. When using explosion resistant process control devices, the installation site and/or technician typically must obtain clearance or a hot-work permit to perform work (e.g., maintenance, diagnostics, and/or routine checks) on the device or must alternatively decommission and relocate the instrument in order to modify its operation. This process can be both time-consuming and costly. Further, explosion resistant process control devices typically do not allow access to the components contained therein, as any breach of the container may impact the ability of the controller to withstand explosive forces. Accordingly, in order to communicate with the controllers (e.g., to send commands, modify inputs, and/or adjust variables); existing explosion resistant controllers have used a variety of technologies such as optical, and/or magnetic systems to communicate with components contained within the enclosure.

In environments where optical systems are used for communication with the controller, transmitter/receiver pairs are used to interface with the process control device in the explosion resistant container. Light from the transmitter reflects off of an input device (e.g., a user's finger) and the reflected light is received at the receiver signaling an input to the process control device. These systems are limited by both power constraints and the fact that only a discrete number of inputs may be available. As an example, some explosion resistant controllers are used in environments that have a 4-20 mA signal to power the device. Optical systems oftentimes require at least half of this available power for proper operation of systems. Thus, they generally cannot be used for more complex installations. Further, these systems are limited because, in some cases, each desired input of the instrument can require its own optical sensor, which, due to size and power constraints, can limit the number of total sensors that can be used within the enclosure. In addition, these systems can be unreliable due to the likelihood of non-transparent material such as dirt and/or grime depositing on enclosure surface. Similarly, in environments where magnetic systems are used, a physical button is actuated which creates or disrupts a magnetic field signaling an input. These interfaces are typically constrained by their size and thus may only have a limited number of discrete inputs.

SUMMARY

In accordance with one aspect, an apparatus includes a housing, a touch sensor, a display, and a control module. The housing has a body defining a volume to accommodate a process control device and is adapted to withstand a threshold internal pressure greater than an external pressure. The housing further has a transparent portion having first and second surfaces. The touch sensor is disposed adjacent to the second surface of the transparent portion and senses an input received within a minimum distance from the first surface of the transparent portion. The display is disposed adjacent to the touch sensor and displays at least one adjustable variable corresponding to the process control device.

In some forms, the housing may include a facing surface that contacts a portion of the first surface of the transparent portion. The facing surface may include a channel to accommodate a packing member to create a seal between the interface and the housing. The interface may be coupled to the housing via a sealing resin.

In accordance with another aspect, a method of manufacturing a process control device includes providing a housing having a body defining a volume to accommodate a process control device and being adapted to withstand a threshold internal pressure greater than an external pressure, and a transparent portion having a first surface and a second surface. The process control device is at least partially disposed in the volume of the housing. A touch sensor is disposed adjacent to the second surface of the transparent portion, a display is disposed adjacent to the touch sensor, and a controller is coupled to the touch sensor and the display. The housing is then sealed.

In accordance with yet another aspect, a process control device includes a housing having a body defining a volume to accommodate a process control device having at least one variable, a second housing having a body defining a volume to accommodate at least a portion of the first housing, an interface coupled to at least one of the first housing or the second housing, a touch sensor disposed adjacent to the second surface of the interface, a display disposed adjacent to the touch sensor and displaying the at least one adjustable variable of the controller, and a control module disposed within the housing. The controller is at least partially disposed within the volume of the first housing. The touch sensor is adapted to sense an input received within a distance from the first surface of the interface. The control module is coupled to the sensor, the display, and the electro-pneumatic controller. Upon receiving the input, the sensor transmits a signal to the control module to cause the control module to adjust the at least one adjustable variable.

So configured, by using a touch sensor, a user can communicate with the controller without having to decommission the device. Further, the touch sensor is capable of operating in various environments unsuitable for optical sensors. The touch sensor can provide more design versatility by accepting any number of discrete or non-discrete inputs and/or adjustable variables while consuming less power. These components also have no finite lifetime.

BRIEF DESCRIPTION OF THE DRAWINGS

The above needs are at least partially met through provision of the explosion proof local user interface described in the following detailed description, particularly when studied in conjunction with the drawings, wherein.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

DETAILED DESCRIPTION

Figure 1:
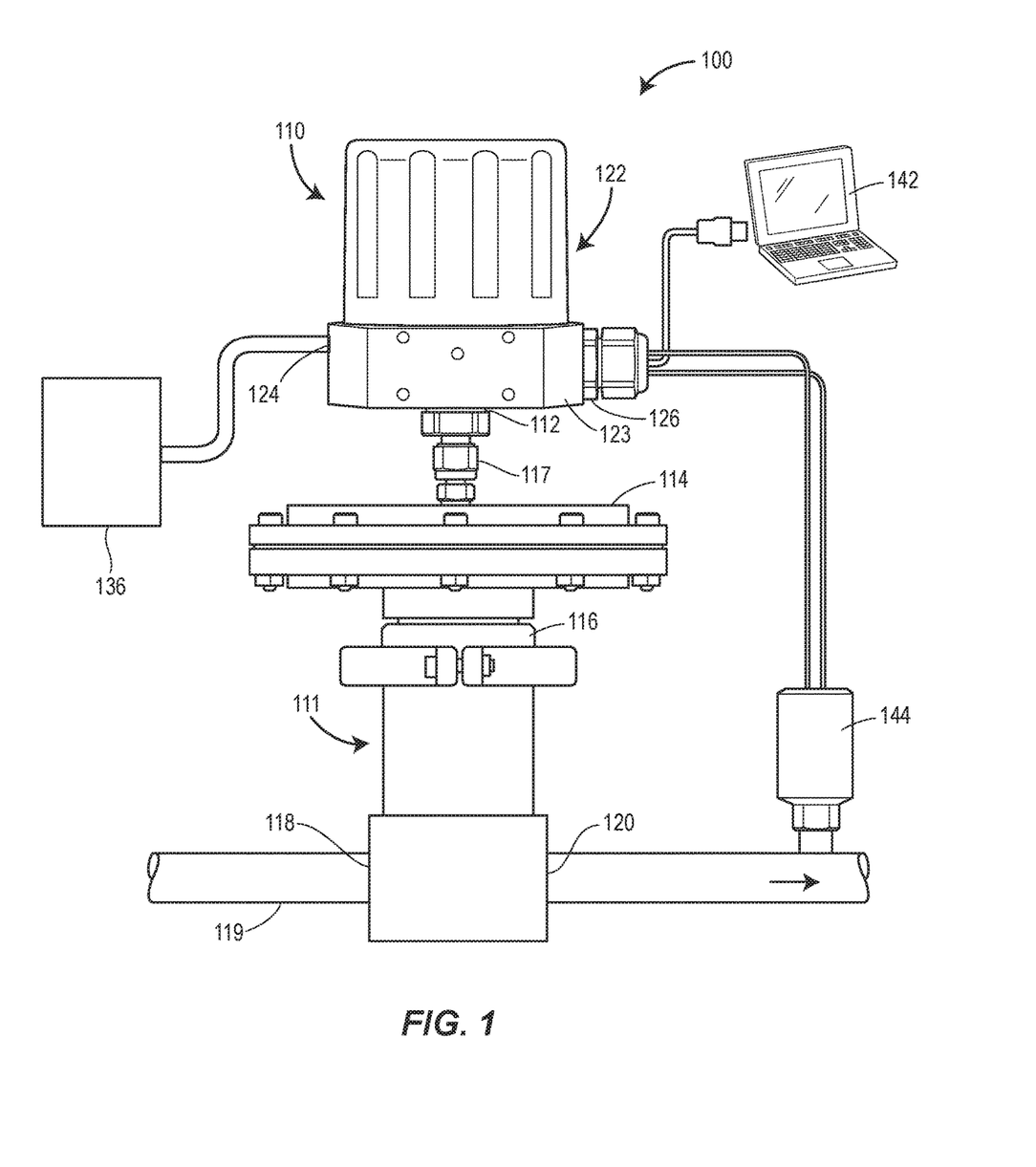
FIG. 1 illustrates an example process control system having an explosion proof controller in accordance with various embodiments.

As illustrated in FIG. 1, a system 100 includes a process control device 110, depicted in this example as an electro-pneumatic controller that is operatively coupled to a regulator 111. Specifically, an outlet port 112 of the process control device 110 is operatively coupled to a top portion 114 of a housing 116 of the regulator 111 via an adaptor 117, for example. The regulator 111 includes an inlet 118 for receiving inlet pressure in a line 119, and an outlet 120 for directing outlet pressure downstream the regulator 111 in the process line 119. The process control device 110 may be coupled to any number of alternative and/or additional process control devices disposed in an environment that necessitates the use of the process control device 110.

The process control device 110 includes a housing 122 having a body 123 that includes a supply port 124 for receiving supply pressure from an external source, such as supply source 136. The body 123 may also include any number of conduit connections such as a first conduit connection 126 (e.g., a USB connection) for wiring to a computer 142 and a second conduit (not shown) connection for internal wiring.

The computer 142 may be communicatively coupled to the process control device 110 via the first conduit connection 140 for USB wiring. A transducer 144 may be disposed downstream the outlet 120 of the regulator 111 and may be communicatively coupled to the process control device 110 for signal conversion purposes. In one example of typical operation of the process control device 110, the process control device 110 may sense system pressure through input, e.g., a feedback signal, from the transducer 144. The process control device 110 can read the input and compare it to a set point pressure, which the process control device 110 may receive from an external source, such as the computer 142, or from a profile on its onboard memory, for example.

By one measure, the housing 122 is considered explosion resistant if it is capable of withstanding a threshold internal pressure (which may be a used as a proxy for being capable containing an explosion therein). In some examples, such a housing 122 may be designed to be in conformance with one or more standards, such as International Electrotechnical Commission (IEC) 60079. To determine whether a housing is capable of containing an explosion therein, testing may be conducted where a detonation is initiated within the housing 122 while measuring the resulting pressure. The housing 122 must be able to withstand a safety factor beyond this resulting pressure. For example, a supply pressure of up to 120 psig/8.2 bar, with 110 psig/7.5 bar being typical, may be provided to the explosion proof housing 122. A threshold internal pressure may be approximately three to approximately 15 times this supply pressure. Accordingly, the housing 122 may have any number of suitable dimensions and/or configurations to withstand this threshold pressure, such as having a specified thickness (e.g., approximately 10 mm), materials (e.g., aluminum and/or steel), and the like. Of course, this is but one measure and standard by which to define a housing as explosion proof or explosion resistant, and those of ordinary skill in the art will understand and recognize alternative measures and standards.

Figure 2:
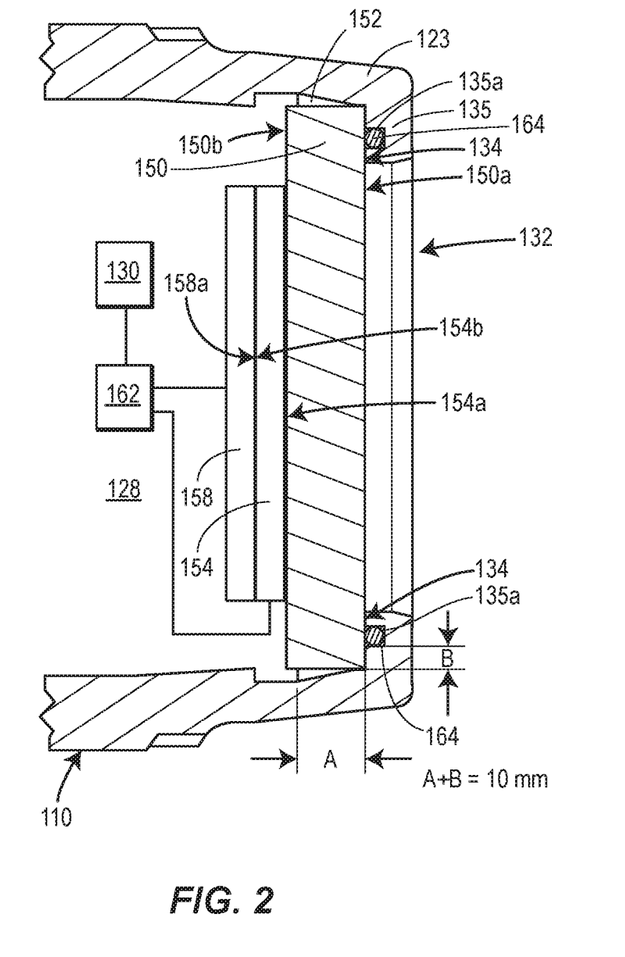
FIG. 2 illustrates a cross-sectional view of the example explosion proof controller of controller of FIG. 1 in accordance with various embodiments.
Figure 3:
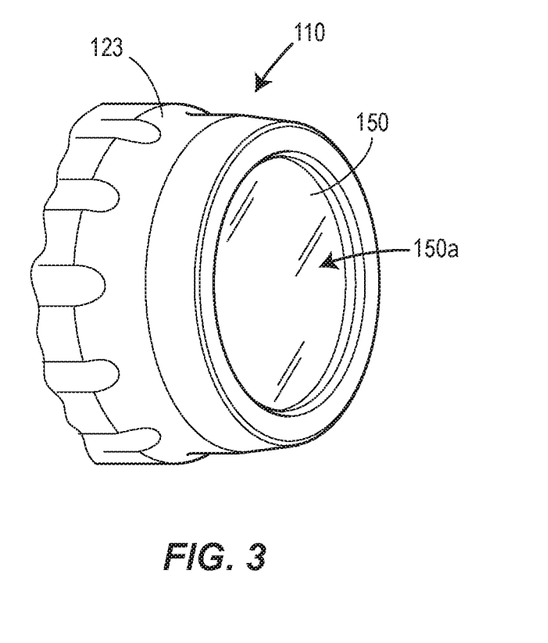
FIG. 3 illustrates a perspective view of the example explosion proof controller of FIGS. 1 and 2 in accordance with various embodiments.

In the embodiment illustrated in FIGS. 2 and 3, the process control device 110 further includes a controller 130, a transparent portion (e.g., a window) 150, a touch sensor 154, a display 158, and a control module 162. The controller 130 is used to control and/or adjust operation of the regulator 111, and may include any number of adjustable variables that impact operation of the regulator 111. The body 123 of the housing 122 defines a volume 128 to accommodate the controller 130. The housing 122 can be constructed from any number of materials that are capable of withstanding explosive pressures and/or forces in a number of environments per the IEC 60079 standard, for example. The body 123 further can define an opening 132 and a facing surface 134 which, in the illustrated example, is formed by a ledge portion 135 that surrounds the opening 132.

The transparent portion 150 includes a first surface 150a and a second surface 150b. The transparent portion 150 may be constructed from any number of suitable materials such as a polymer or a non-crystalline amorphous solid (e.g., a glass) capable of withstanding the threshold pressure and/or explosive forces in any number of environments as explained above. In some examples, the transparent portion 150 is generally transparent or translucent to allow a user to see into the volume 128 of the housing 122. The transparent portion 150 is coupled to the housing 122 to at least partially cover the opening 132 via any number of securing and/or sealing approaches. In the illustrated example, the first surface 150a of the transparent portion 150 abuts and/or contacts the facing surface 134 of the body 123. Further, in some examples, a sealing resin 152 may be used to secure the transparent portion 150 to the explosion proof housing 122. Other examples of sealing components and/or methods may be used. In some examples, the ledge 135 of the body 123 may form a channel 135a that accommodates a packing member 164 (e.g., an O-ring) to create an additional seal between the transparent portion 150 and the explosion proof housing 122.

In the illustrated example, a contact dimension is used to ensure the process control device 110 can withstand gasses contained therein from creepage through the housing. A first dimension (denoted by "A" in FIG. 2) represents a length of contact along the width of the transparent portion 150 and the body 123. More particularly, the dimension A represents the length of the sealing resin 152 along the width of the transparent portion 150. A second dimension (denoted by "B" in FIG. 2) represents a length of contact between the first surface 150a of the transparent portion 150 and the facing surface 134 that is "downstream" or sealed off from the packing member 164. In these examples, a treacherous path is equal to the contact dimension is the sum of lengths A and B. If the contact dimension is greater than approximately 10 mm, the process control device 110 is capable of avoiding gaseous creepage through the housing 122.

In the illustrated example, the touch sensor 154 has a first surface 154a and a second surface 154b. The first surface 154a of the touch sensor 154 is disposed adjacent to the second surface 150b of the transparent portion 150. By "adjacent", it is meant either directly contacting or being in close proximity. In the illustrated example, the first surface 154a of the touch sensor 154 abuts against the second surface 150b of the transparent portion 150, but in other examples, there may be a gap between the first surface 154a of the touch sensor 154 and the second surface 150b of the transparent portion 150. As understood by those of ordinary skill in the art, the size of the gap (or no gap) may be dependent on the sensitivity of the sensor 154. In some examples, an adhesive (such as, for example LORD 7545A/B Urethane Adhesive) may be used to couple the touch sensor 154 to the transparent portion 150, and in other examples, any number of devices such as mechanical fasteners may be used to couple the sensor 154 to the transparent portion 150.

The touch sensor 154 may be any type of sensor that measures or senses an input received within a distance from the first surface 150a of the transparent portion 150. Accordingly, the term "touch" may refer to physical contact between two objects and/or near contact between two objects. For example, the touch sensor 154 may be a capacitive touch sensor that measures a localized change in capacitance on the first surface 150a of the transparent portion 150. In other examples, the touch sensor 154 may be a deflection-based capacitor that measures localized deflection. In examples using a capacitive sensor, the capacitive sensor may be in the form of a self-capacitance sensor (where the object, such as a finger, loads the sensor or increases a parasitic capacitance to ground) or a mutual-capacitance sensor (where the object alters a mutual coupling between sequentially-scanned row and column electrodes). Other examples of suitable touch sensors 154 may be used.

For example, a resistive touch sensor may be used and coupled to the display 158 in examples where the display 158 is disposed outside of the housing 122. In such a configuration, the display 158 and the touch sensor 154 may be positioned remotely when the process control device 110 is installed in difficult to access locations. Further, in these configurations, the housing 122 may be provided without a transparent portion, and thus the body 123 may be unitary. As such, the process control device 110 may be completely enclosed, which may avoid fluid (e.g., liquid or gas) creepage issues where fluids may eventually seep out of the housing 122.

The touch sensor 154 may be in the form of a thin film sensor, and is communicatively coupled to the control module 162. The sensitivity of the sensor 154 may at least partially determine a maximum distance at which an input may be sensed. For example, the sensor 154 may be a projective capacitive touch sensor that projects an electromagnetic field greater than the thickness of the transparent portion 150 so as to spread across a surface thereof. In another example, the sensor 154 may use frustrated total internal reflection (FTIR) to sense touch in which case the transparent portion may be acrylate or other suitable materials to maintain total internal reflection. In any case, the touch sensor 154 may sense an input received against the transparent portion 150 or one proximal to the transparent portion as understood by those of ordinary skill in the art.

The display 158 is also communicatively coupled to the control module 162, and generates an image or images that depict the adjustable variable or variables corresponding to the controller 130. The display 158 may be any type of suitable display, such as a liquid crystal display (LCD), a light-emitting diode (LED) display, a plasma display panel (PDP), an organic light-emitting diode (OLED) display, and so on. In some examples, the display 158 may be a lower functioning character display (e.g., a thin-film-transistor or TFT display) having a lower resolution and may be limited to providing a discrete number of inputs.

The control module 162 may be any type of device having inputs and outputs to control and/or adjust operation of the controller 130. For example, the control module 162 may be in the form of a computing device having any number of inputs and outputs, a non-transitory memory, and a processor programmed to control and/or adjust operation of the controller 130. The control module 162 may include any number of additional components to control and/or adjust operation of the controller 130.

In operation, a user may view the image generated by the display 158 through the transparent portion 150, and may wish to adjust an adjustable variable of the controller 130. By touching (or coming in near or close contact with) the first surface 150a of the transparent portion 150, the touch sensor 154 senses this contact or near contact by detecting a change in electrical current derived from anything that can hold an electrical charge (e.g., a user's finger) as a change in capacitance at a particular location. This sensed contact or near contact is transmitted to the control module 162, which then determines the particular adjustable variable or variable of the controller 130 to adjust. The control module 162 then transmits a signal to the controller 130 to adjust the adjustable variable. Accordingly, any number of discrete inputs may be adjusted via the display 158 and the sensor 154. In some examples, interaction with the display 158 may also occur in a non-discrete manner using the sensor 154. Specifically, in some examples, a user may interact with contents on the display 158 using any number of non-discrete inputs such as swiping to pan, multi-finger gestures to move and/or zoom the interface, and the like. Accordingly, the display 158 may present a complex interface to a user to adjust any number of variables and which may accommodate a number of graphical user interfaces.

So configured, operating parameters of the controller 130 may be adjusted on the fly, as a user need not decommission and/or remove the process control device 110 from its operating environment. Further, a user need not physically touch the transparent portion 150 when adjusting the adjustable variable, which may avoid reducing visibility of the display 158 due to dirt and/or grime depositing on the transparent portion 150. Nonetheless, the touch sensor 154 can still sense a change in capacitance of the transparent portion 150 even in the presence of dirt and/or grime on the first surface 150a of the transparent portion 150. In examples where the touch sensor 154 is a projected capacitance sensor, the touch sensor 154 may be highly sensitive to accurately sense a change in capacitance through the transparent portion 150 which is suitably wide or thick to withstand a threshold internal pressure and/or an explosion or explosions.

In examples where the sensor 154 is in the form of a deflection-based capacitor that measures localized deflection, the body 123 may be provided without a transparent portion 150, and can rather rely on an indication of discrete inputs on the body 123. For example, when the housing is constructed from a metallic material (e.g., aluminum) and uses a deflection-based sensor, a surface of the body 123 may have an etching, paint, or other indication of discrete inputs. As such, a user may provide inputs by pressing localized areas that correspond to the discrete inputs. As a result, the housing 122 may be a unitary structure that may reduce and/or eliminate any fluid creepage issues.

Further, in some embodiments, an external display (not shown) may be used with an external sensor having any number of discrete and/or non-discrete inputs to provide an indication of inputs to the controller 130. In these examples, the body 123 may be coupled to the external display using any number of suitable approaches. So configured, the controller 130 may have a reduced footprint that still is capable of containing explosions, but the external display may be positioned remotely for ease of accessibility.

Figure 4:
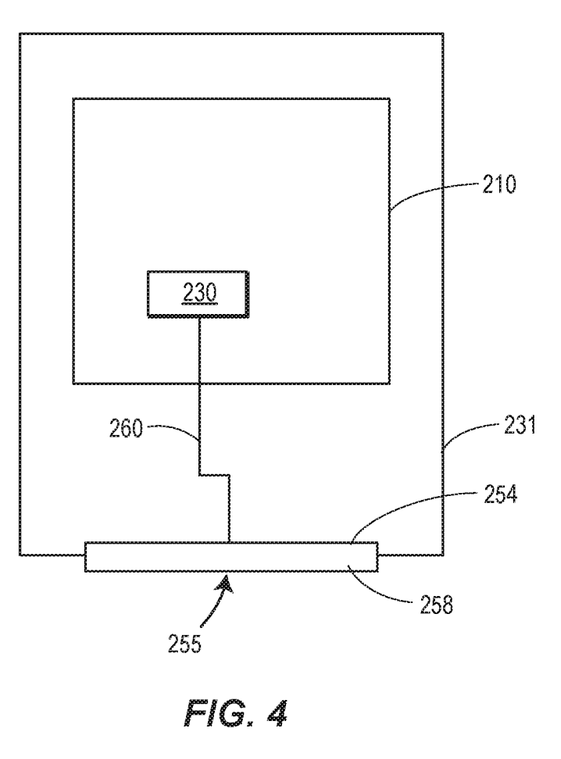
FIG. 4 illustrates a schematic of an alternative field device having first and second housings in accordance with various embodiments.

As illustrated in FIG. 4, in some examples, a process control device 230 may be disposed in an inner volume of a first housing 210 which is in turn disposed in an inner volume of a second housing 231. In some examples, the second housing 231 may be capable of withstanding a threshold internal pressure greater than an external pressure, while the first housing 210 may or may not be capable of withstanding the threshold internal pressure greater than the external pressure. The second housing 231 may further accommodate any number of additional components such as an interface 255 in the form of a display 258 and/or input buttons and the like. Further, the second housing 231 may include a sensor 254 which may be a capacitive or other sensor previously described. The electro-pneumatic controller 230 may be communicatively coupled to the interface 255 via a communication link 260 which may be any type of wired or wireless component or components. In other examples, these components may be located externally from the second housing 231. In the event of an explosion, the first and/or the second housing 230, 231 will contain the explosion, while shielding the additional components disposed externally from damage.

So configured, the process control device 110 described herein may allow for additional interaction with the components contained therein, thereby allowing for increased system complexity. In some embodiments, the controller 130 may be used in a diagnostics mode whereby the display 158 provides an interface that illustrates current operating conditions of the control system 100. In other words, the display 158 may be used not only to interact with the controller 130, but it further may be used to interact with other components within the system 100 that are positioned either upstream or downstream from the controller 130 such as, for example, the regulator 111. In some of these examples, the display 158 and/or the sensor 154 may be used in a non-explosive environment where a touch (or near-touch) screen is needed. Additionally, due to lower power constraints, the process control device 110 may be capable of using advanced graphical user interfaces to accommodate additional inputs and better control.

Those skilled in the art will recognize that a wide variety of modifications, alterations, and combinations can be made with respect to the above described embodiments without departing from the scope of the invention, and that such modifications, alterations, and combinations are to be viewed as being within the ambit of the inventive concept.

The patent claims at the end of this patent application are not intended to be construed under 35 U.S.C. § 112(f) unless traditional means-plus-function language is expressly recited, such as "means for" or "step for" language being explicitly recited in the claim(s). The systems and methods described herein are directed to an improvement to computer functionality, and improve the functioning of conventional computers.

What is claimed is:

1. An apparatus comprising:
   a housing having a body defining a volume to encapsulate a controller that controls operation of a field device, and adapted to withstand a threshold internal pressure greater than an external pressure, the body having a transparent portion having a first surface, a second surface, and a third surface extending between the first and the second surface;
   a touch sensor disposed adjacent to the second surface of the transparent portion, the touch sensor adapted to sense an input received within a minimum distance from the first surface of the transparent portion; and
   a display disposed adjacent to and communicatively coupled to the touch sensor and the controller to display at least one adjustable variable of the controller,
   wherein at least a portion of the third surface of the transparent portion defines a first contact dimension, and at least a portion of the first surface of the transparent portion defines a second contact dimension, wherein a total length of the first contact dimension and the second dimension define a treacherous path, wherein the treacherous path is greater than approximately 10 mm.

2. The apparatus of claim 1, further comprising:
   a control module disposed within the housing, the control module being coupled to the touch sensor, the display, and the controller;
   wherein upon receiving the input, the touch sensor transmits a signal to the control module to cause the control module to adjust the at least one adjustable variable.

3. The apparatus of claim 1, wherein the touch sensor comprises a capacitive sensor.

4. The apparatus of claim 3, wherein the capacitive sensor comprises a self-capacitance sensor.

5. The apparatus of claim 3, wherein the capacitive sensor comprises a mutual-capacitance sensor.

6. The apparatus of claim 1, wherein the touch sensor comprises a deflection based sensor.

7. The apparatus of claim 1, wherein the touch sensor comprises a projective sensor.

8. The apparatus of claim 1, wherein the transparent portion comprises a window constructed from a polymer or a non-crystalline amorphous solid.

9. The apparatus of claim 1, wherein the housing includes a facing surface that contacts the portion of the first surface of the transparent portion to define the second contact dimension.

10. The apparatus of claim 9, wherein the facing surface includes a channel, the apparatus further comprising a packing member adapted to be disposed within the channel to create a seal between the transparent portion and the housing.

11. The apparatus of claim 1, wherein the explosion proof window is coupled to the explosion proof housing via a sealing resin.

12. The apparatus of claim 1, wherein the display comprises a liquid crystal display.

13. A method of manufacturing a process control device, the method comprising:
   providing a housing having a body defining a volume to encapsulate a controller that controls operation of a field device, and adapted to withstand a threshold internal pressure greater than an external pressure, the body further having a transparent portion having a first surface, a second surface, and a third surface extending between the first and the second surface;
   at least partially disposing the controller device in the volume of the housing;
   disposing a touch sensor adjacent to the second surface of the transparent portion;
   disposing a display adjacent to the touch sensor;
   coupling a control module to the touch sensor and the display; and
   sealing the housing such that the controller is encapsulated therein and such that at least a portion of the third surface of the transparent portion defines a first contact dimension, and at least a portion of the first surface of the transparent portion defines a second contact dimension, wherein a total length of the first contact dimension and the second dimension define a treacherous path, wherein the treacherous path is greater than approximately 10 mm.

14. The method of claim 13, wherein the housing is sealed to via a sealing resin.

15. The method of claim 13, wherein the housing includes facing surface including a channel, the method further comprising disposing a packing member within the channel to create a seal between the transparent portion and the housing.

16. An apparatus comprising:
   a first housing having a body defining a volume to encapsulate a process control device;
   a second housing having a body defining a volume to encapsulate the first housing, the second housing being capable of withstanding a threshold internal pressure greater than an external pressure;
   an interface coupled to at least one of the first housing or the second housing, the interface having a first surface, a second surface, and a third surface extending between the first and the second surface, wherein at least a portion of the third surface defines a first contact dimension and at least a portion of the first surface defines a second contact dimension, wherein a total length of the first and second contact dimensions define a treacherous path of greater than approximately 10 mm;
   a touch sensor disposed adjacent to the interface, the touch sensor adapted to sense an input received within a minimum distance from the interface;
   a display disposed adjacent to the touch sensor; and
   a control module disposed within the first housing, the control module being coupled to the touch sensor, the display, and the process control device.

17. The apparatus of claim 16, wherein the interface is capable of withstanding the threshold internal pressure greater than the external pressure, wherein the housing and the interface form a treacherous path of greater than approximately 10 mm.

18. The apparatus of claim 16, wherein the second housing further accommodates a field instrument.

19. The apparatus of claim 16, wherein the touch sensor comprises a capacitive sensor.

20. The apparatus of claim 19, wherein the capacitive sensor comprises a self-capacitance sensor.

21. The apparatus of claim 19, wherein the capacitive sensor comprises a mutual-capacitance sensor.

22. The apparatus of claim 16, wherein the interface is constructed from a polymer or a non-crystalline amorphous solid.

23. The apparatus of claim 16, wherein the interface is constructed from a metallic compound, wherein the touch sensor comprises a deflection-based sensor.

* * * * *

UNITED STATES PATENT AND TRADEMARK OFFICE
CERTIFICATE OF CORRECTION

PATENT NO. : 10,503,332 B2  
APPLICATION NO. : 15/723033  
DATED : December 10, 2019  
INVENTOR(S) : Davin S. Nicholas et al.

Page 1 of 1

It is certified that error appears in the above-identified patent and that said Letters Patent is hereby corrected as shown below:

In the Specification

At Column 4, Lines 2-3, "conduit connection 140" should be -- conduit connection 126 --.

At Column 4, Line 16, "a used as" should be -- used as --.

At Column 4, Line 16, "capable" should be -- capable of --.

At Column 5, Line 3, "ledge 135" should be -- ledge portion 135 --.

At Column 7, Line 55, "second housing 230, 231" should be -- second housing 210, 231 --.

In the Claims

At Column 8, Line 62, "deflection based" should be -- deflection-based --.

At Column 9, Line 40, "to via" should be -- via --.

Signed and Sealed this  
Fifth Day of April, 2022

Drew Hirshfeld  
*Performing the Functions and Duties of the  
Under Secretary of Commerce for Intellectual Property and  
Director of the United States Patent and Trademark Office*